United States Patent
Kanaoka et al.

(10) Patent No.: US 7,058,878 B2
(45) Date of Patent: Jun. 6, 2006

(54) DATA PROCESSING APPARATUS USING ITERATIVE DECODING

(75) Inventors: Toshikazu Kanaoka, Kawasaki (JP);
Masakazu Taguchi, Kawasaki (JP);
Akihiro Itakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 485 days.

(21) Appl. No.: 10/368,416

(22) Filed: Feb. 20, 2003

(65) Prior Publication Data

US 2003/0182617 A1 Sep. 25, 2003

(30) Foreign Application Priority Data

Mar. 25, 2002 (JP) ............................. 2002-084257

(51) Int. Cl.
*H03M 13/03* (2006.01)

(52) U.S. Cl. ...................... 714/794; 714/795; 375/262; 375/341

(58) Field of Classification Search ................. 714/794, 714/795; 375/341, 262
See application file for complete search history.

(56) References Cited

U.S. PATENT DOCUMENTS

| 6,023,783 A * | 2/2000 | Divsalar et al. ............. 714/792 |
| 6,307,901 B1 * | 10/2001 | Yu et al. ..................... 375/341 |
| 6,536,010 B1 * | 3/2003 | Brink .......................... 714/794 |
| 6,654,927 B1 * | 11/2003 | Sall et al. ................... 714/786 |
| 2001/0052104 A1 * | 12/2001 | Xu et al. ..................... 714/792 |
| 2002/0184596 A1 * | 12/2002 | Dinc et al. .................. 714/794 |
| 2003/0005384 A1 * | 1/2003 | Itakura ........................ 714/755 |

* cited by examiner

*Primary Examiner*—Guy Lamarre
*Assistant Examiner*—Sam Rizk
(74) *Attorney, Agent, or Firm*—Arent Fox PLLC

(57) ABSTRACT

A data signal processing apparatus is capable of reproducing original data with a small number of repetition times of an iterative decoding process, which is realized by likelihood information operating means that generate updated likelihood information, carry out a predetermined operation on a plurality of pieces of likelihood information corresponding to the original data obtained by the iterative decoding process, and reproduce the original data.

11 Claims, 10 Drawing Sheets

DATA PROCESSING APPARATUS USING ITERATIVE DECODING

BACKGROUND OF THE INVENTION

1. Field of the Invention

The present invention generally relates to a data processing apparatus that processes encoded data by iterative decoding, and especially relates to a data signal processing apparatus that is configured to reproduce likelier data based on likelihood information acquired in the iterative decoding process.

2. Description of the Related Art

Data encoding and decoding processes are carried out in data transmitting/receiving units used in communication fields, such as mobile communications using cellular telephone terminals, satellite communications, and the like, optical disk apparatuses, magnetic disk drives, and so on. In recent years, the amount of data to be processed has been increasing due to transmission of pictures (still pictures, and moving pictures), music, etc., resulting in requirements of massive data transmission, massive memory, high-speed transmission, etc.

As data signal processing apparatuses that meet such requirements, there are, for example, turbo encoding units, LDPC (Low Density Parity Check Code) units, and decoding units corresponding to them. Hereafter, an outline of an example of a turbo encoding unit and a decoding unit corresponding thereto is explained.

Turbo encoding is an encoding technology that provides a high encoding gain, and has attracted attention in the communication fields. Generally, a turbo encoding unit includes two recursive systematic convolutional encoders that encode a data bit sequence u, and is configured, for example, as shown in FIG. 1 and FIG. 2.

In reference to FIG. 1, the turbo encoding unit has a first encoder 11, an interleaver ($\pi$1) 12, a second encoder 13, and a multiplexer 14. A data bit sequence u is provided to the second encoder 13 through the interleaver ($\pi$1) 12, and the first encoder 11.

The first encoder 11 and the second encoder 13 are recursive systematic convolutional encoders, and the first encoder 11 generates a parity bit sequence p1 that corresponds to the data bit sequence u that is input. Further, the interleaver ($\pi$1) 12 outputs a signal sequence that represents the data bit sequence u with the bit arrangement order changed. The second encoder 13 generates a parity bit sequence p2 that corresponds to the signal sequence from the interleaver ($\pi$1) 12.

The multiplexer (MUX/puncture) 14 multiplexes the data bit sequence u, the parity bit sequence p1 output from the first encoder 11 and the parity bit sequence p2 output from the second encoder 13 according to a predetermined rule, and generates an encoded data bit sequence yk. Further, when the data bit sequence u, and the parity bit sequences p1 and p2 are multiplexed, the multiplexer 14 culls out bits (puncture function) according to a predetermined rule, and raises the rate of encoding (encoding rate). The encoded data bit sequence yk generated as mentioned above is output from the turbo encoding unit. In a communication system, the encoded data bit sequence yk is transmitted from a transmitting unit after a modulating process in a predetermined manner.

A turbo encoding unit that is configured as shown in FIG. 2 includes two recursive systematic convolutional encoders (the first encoder 11 and the second encoder 13) that are connected in series via the interleaver ($\pi$1) 12. In reference to FIG. 2, the data bit sequence u is encoded by the first encoder 11, and the bit arrangement order of the signal sequence obtained by the first encoder is changed by the interleaver ($\pi$1) 12. Then, the signal sequence output from the interleaver ($\pi$1) 12 is encoded by the second encoder 13, and the signal sequence obtained by the second encoder is output as the encoded data bit sequence yk.

When a signal transmitted from a transmitting unit is received by a receiving unit, the received signal is demodulated, and signal value sequences U, Y1, and Y2 corresponding to the data bit sequence u contained in the encoded data bit yk and the parity bit sequences p1 and p2, respectively, are obtained. The signal value sequences U, Y1, and Y2 are provided to a decoding unit that corresponds to the turbo encoding unit.

In the decoding unit that corresponds to the turbo encoding unit, soft-output decoding is carried out by two decoders corresponding to the two encoders, and soft-output information (likelihood information) about each information bit obtained by one of the decoders is provided to the other decoder as prior information. Then, such operation is performed repeatedly. For example, the decoding unit is configured as shown in FIG. 3 in order to process the decoded signal sequences U, Y1, and Y2 corresponding to bit sequences u, p1, and p2, respectively, contained in the encoded data bit sequence yk output from the turbo encoding unit that is shown in FIG. 1.

In reference to FIG. 3, the decoding unit includes a first soft-input soft-output decoder (SISO: Soft In Soft Out) 21, interleavers ($\pi$1) 22 and 23, a de-interleaver ($\pi$1$^{-1}$) 25, a second soft-input soft-output decoder (SISO) 24, and a hard decision unit 26. The first soft-input soft-output decoder 21 corresponds to the first encoder 11, and the second soft-input soft-output decoder 24 corresponds to the second encoder 13.

The first soft-input soft-output decoder 21 receives the signal value sequences U and Y1, and further receives prior information L(u) from the second soft-input soft-output decoder 24, and performs maximum a posteriori probability (MAP) decoding in order to ascertain a posteriori probability of each bit. The a posteriori probability is the probability of whether a bit uk is 0 or 1 under the conditions in which a signal value sequence Y (y0, y1, ..., yk, ..., yn) is detected. In MAP decoding, a log likelihood ratio L(u*) is calculated, which is a log ratio of the a posteriori probability P(uk|Y), according to the following formula.

$$L(u^*)=L(uk|Y)=\ln\{P(uk=1|Y)/P(uk32\ 0|Y)\} \quad (1)$$

Here, in the formula (1), the signal value sequence Y represents the received signal value sequences U and Y1.

The probability of the bit uk being 1 is expressed by P(uk=1|Y), and the probability of the bit uk being 0 is expressed by P(uk=0|Y), which are calculated based on the trellis diagram that shows transition status obtained from the signal value sequences U and Y1.

Further, the log likelihood L(u*) is also expressed by the following formula.

$$L(u^*)=Lc \times yk+L(uk)+Le(uk) \quad (2)$$

Here, Lc×yk is a communication path value, where Lc is a constant (communication path value constant) defined by S/N, and yk represents a received signal series y0, y1, ..., yn). Further, L(uk) represents prior information about known appearance probability of uk=0 and uk=1, and Le(uk) represents extrinsic likelihood information relative to uk, which is obtained by constraint of a code.

From the formula (2), the first soft-input soft-output decoder 21 calculates the extrinsic likelihood information Le(uk) according to the following formula.

$$Le(uk) = L(u^*) - Lc \times yk - L(uk) \qquad (3)$$

By substituting L(u*) of the formula (3) with the log likelihood ratio L(u*) calculated by the formula (1), the extrinsic likelihood information Le(uk) is obtained. A sequence of pieces of the extrinsic likelihood information Le(uk) acquired one by one in this manner is supplied to the second soft-input soft-output decoder 24 as a sequence of prior information L(uk) through the interleaver ($\pi$1) 23. The second soft-input soft-output decoder 24 receives the sequence of the prior information L(uk), the signal value sequence U through the interleaver ($\pi$1) 22, and the signal value sequence Y2.

The second soft-input soft-output decoder 24 calculates an updated log likelihood ratio L(u*) based on the formula (1) and the prior information L(uk) that is input. Then, the extrinsic likelihood information Le(uk) is computed according to the formula (3), using the obtained log likelihood ratio L(u*), and the prior information L(uk) provided by the first soft-input soft-output decoder 21.

The extrinsic likelihood information Le(uk) acquired by the second soft-input soft-output decoder 24 is supplied to the first soft-input soft-output decoder 21 as prior information L(uk) through the de-interleaver ($\pi 1^{-1}$) 25. Then, the first soft-input soft-output decoder 21 computes the log likelihood ratio L(u*), and the extrinsic likelihood information Le(uk) based on the prior information L(uk), according to the above-described procedure. The extrinsic likelihood information Le(uk) is used as the prior information L(uk) of the second soft-input soft-output decoder 24.

In this manner, the first soft-input soft-output decoder 21 and the second soft-input soft-output decoder 24 repeat computing processes for obtaining the log likelihood ratio L(u*), using the extrinsic likelihood information Le(uk) computed by the other decoder as the prior information L(uk), hence called iterative decoding. Here, in the beginning of the process of the first soft-input soft-output decoder 21, the prior information L(uk) is set to zero (L(uk)=0).

The hard decision unit 26 determines whether a bit uk is 0 or 1 based on the log likelihood ratio L(u*) obtained by the second soft-input soft-output decoder 24, when the decoding processing has been carried out repeatedly for a predetermined number of times. If, for example, the log likelihood ratio L(u*) is positive (L(u*)>0), the bit uk is determined to be 1 (uk=1), and if, to the contrary, it is negative (L(u*)<0), the bit uk is determined to be 0 (uk=0). Further, the result is output as a decoding result Uk.

As the decoding process is repeated (iterative decoding proceeds), the probability of a bit being 1 becomes greater, and the probability of the bit being 0 becomes smaller, and vice versa. In other words, the difference between the two probabilities becomes greater, that is, the log likelihood ratio of the absolute value of the difference becomes greater, and the reliability of the determination by the hard decision unit 26 is increased.

Studies are being conducted as to applying the turbo encoding and decoding, used by communication systems, as described above, to data recording/reproducing apparatuses such as magnetic disk drives and optical disk apparatuses. An example that applies the turbo encoding and decoding to a magnetic disk drive has been proposed by, e.g., W. E. Ryan, "Performance of High Rate Turbo Codes on a PR4-Equalized Magnetic Recording Channel", Proc. IEEE Int. Conf. On Communications, pp947–951, 1998.

In the data recording/reproducing apparatuses such as above described, turbo encoding is used by a recording system (write-in system) for writing data to a recording medium, and iterative decoding is used by a reproduction system (read-out system) for reproducing the data from the recording medium. By applying these techniques, data that are densely recorded on the recording medium (a magnetic disk, an optical disk, a magneto-optical disk, a magnetic tape, etc.) are reproduced reliably.

With a decoding unit that employs the iterative decoding technique for reproducing data as mentioned above, which is used by a receiving apparatus and a data reproducing apparatus, correct data reproduction is not available when SNR (Signal to Noise Ratio) is noticeably poor because of an obstacle in a communication path, defects (a crack, dust, etc.) of a recording medium, and the like, even if the decoding process is repeated a large number of times, with likelihood information (a log ratio of likelihood), indicative of reliability, tending to be centered near a determination threshold level in a hard determination process.

There may be cases where correct data are correctly reproduced through a large number of iterative decoding processes. However, in these cases, the data transfer rate is degraded.

SUMMARY OF THE INVENTION

Accordingly, it is a general object of the present invention to provide a data signal processing apparatus that is capable of reproducing data based on likelihood information obtained by a comparatively few number of times of decoding processing, and that substantially obviates one or more of the problems caused by the limitations and disadvantages of the related art.

Features and advantages of the present invention will be set forth in the description that follows, and in part will become apparent from the description and the accompanying drawings, or may be learned by practice of the invention according to the teachings provided in the description. Objects as well as other features and advantages of the present invention will be realized and attained by the data signal processing apparatus that is capable of reproducing the data based on likelihood information obtained by a comparatively few number of times of decoding processing, and particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides the data signal processing apparatus as follows.

The present invention provides a data processing apparatus that reproduces original data based on updated likelihood information generated by likelihood information operating means that carry out a predetermined operation of a plurality of pieces of likelihood information obtained by repeating decoding processes according to the iterative decoding technique.

The updated likelihood information that is more reliable is obtained by predetermining an appropriate operation for the plurality of pieces of likelihood information corresponding to the original data.

The updated likelihood information or a decoding result is obtained by hard-decision processing a predetermined number of pieces of updated likelihood information.

The updated likelihood information or the decoding result is used as prior information for the iterative decoding process.

Likelihood information adding means are provided to the likelihood information operating means, such that the reliability of the decision is enhanced.

Likelihood information selecting means are provided such that a piece of likelihood information that is the likeliest is selected as the updated likelihood information.

The likelihood operating means include storage means and operating means, such that operation results are stored and used in subsequent operations in the iterative decoding.

The storage means may be provided with an initial value used in the hard decision process.

The operating means may be provided with adding means that add the likelihood information stored in the storage means and the likelihood information obtained by the decoding process.

The operating means may be provided with selecting means that select a piece of likelihood information that is the likelier of the likelihood information stored in the storage means and the likelihood information obtained by the decoding process.

The likelihood operating means may include storage means that store a predetermined number of pieces of likelihood information corresponding to the original data, obtained by the iterative decoding, and operating means that simultaneously process all the pieces of the likelihood information stored in the storage means in one operation according to a predetermined rule in order to simplify the operation process.

The operating means may include collective adding means that simultaneously add the predetermined number of pieces of the likelihood information in one operation.

Further, the operating means may include collective selecting means for selecting a piece of likelihood information that is the likeliest of all the pieces of the likelihood information.

DESCRIPTION OF THE PREFERRED EMBODIMENTS

In the following, embodiments of the present invention will be described with reference to the accompanying drawings.

Figure 4:
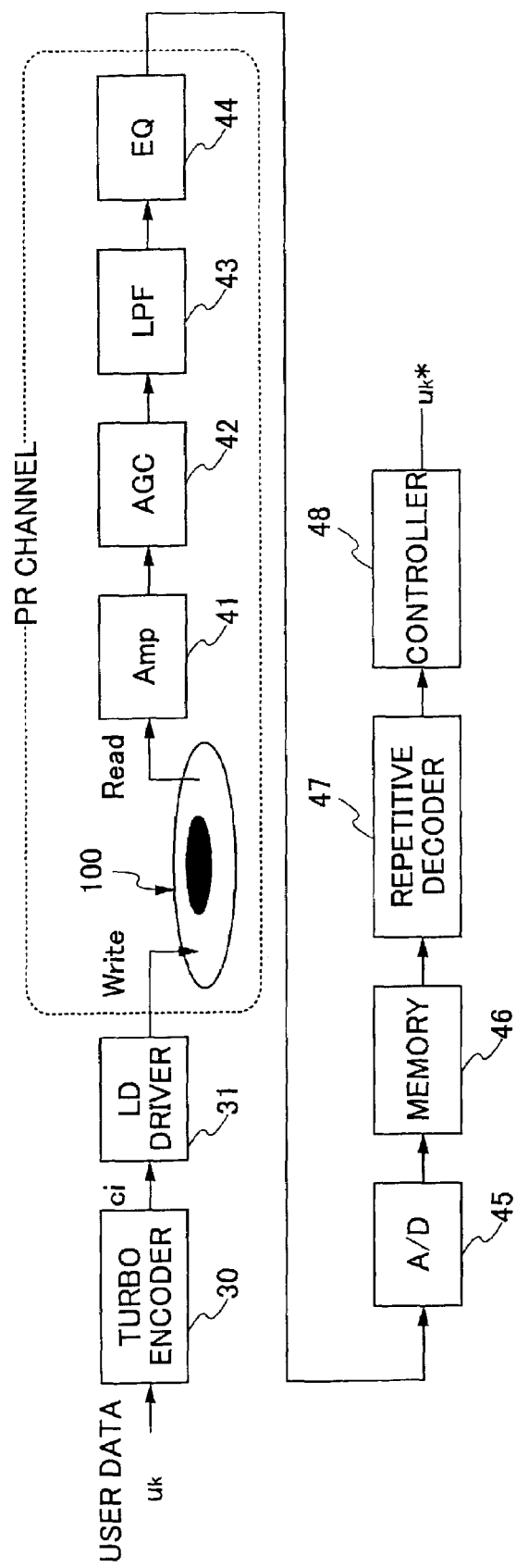
FIG. 4 is a block diagram showing a configuration example of an optical disk apparatus to which a data signal processing apparatus of an embodiment of the present invention is applied.

FIG. 4 shows a configuration of an optical disk apparatus to which a data signal processing apparatus of an embodiment of the present invention is applied.

In reference to FIG. 4, the optical disk apparatus includes a writing system for recording data on an optical disk 100 (magneto-optical disk), and a reading system for reproducing the recorded data from the optical disk 100.

The writing system includes a turbo encoder 30 and an LD driver 31. The turbo encoder 30 generates an encoded data bit sequence ci that is to be written to the magneto-optical disk 100 by performing a turbo encoding process, etc. on a user data sequence uk. The LD driver 31 controls driving of an optical beam output unit (not shown) based on the encoded data bit sequence ci. The optical beam that is output from the optical beam unit, and controlled by the optical beam unit in accordance with the encoded data bit sequence ci writes the data to the optical disk 100. The writing of the data to the optical disk 100 is carried out at high density so that predetermined waveform interference occurs when reproducing the data.

Figure 5:
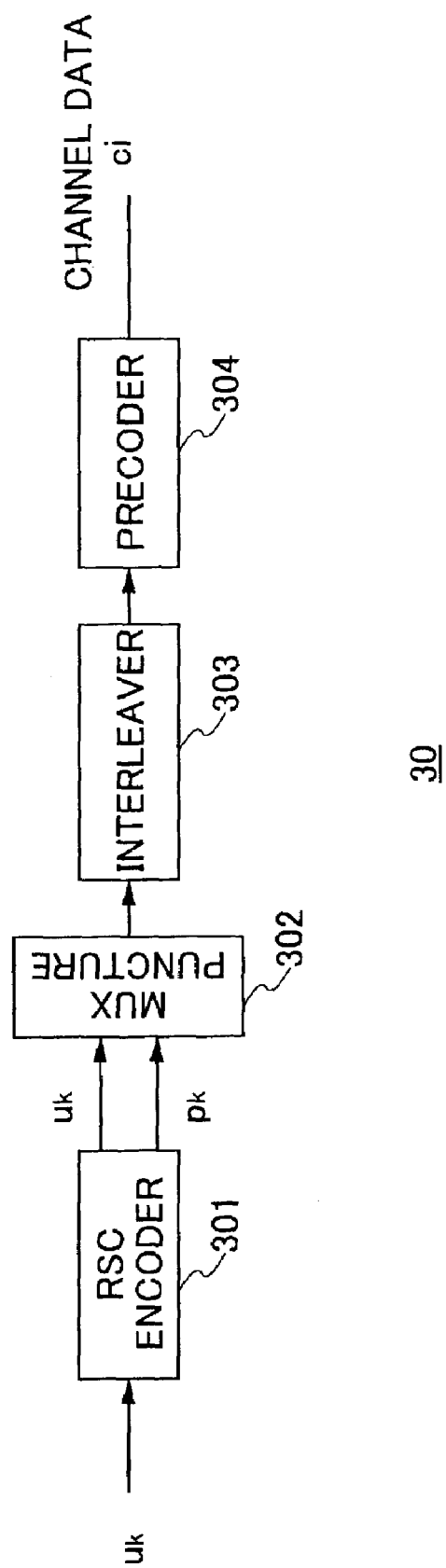
FIG. 5 is a block diagram showing a configuration example of the turbo encoding unit in the optical disk apparatus shown in FIG. 4.

FIG. 5 shows a configuration example of the turbo encoder 30.

In reference to FIG. 5, the turbo encoder 30 includes an RSC (Recursive Systematic Convolution) encoding unit 301, a multiplexer (MUX) 302, an interleaver 303, and a pre-coder 304. The RSC encoding unit 301 encodes the user data sequence uk, using the recursive systematic convolution technique, and outputs the user data sequence uk and a parity bit sequence pk obtained by the encoding.

The multiplexer (MUX) 302 multiplexes the user data sequence uk and the parity bit sequence pk provided by the RSC encoding unit 301 according to a predetermined rule, culls out bits (puncture function) from the multiplexed bit sequence according to a predetermined rule, and generates an encoded data bit sequence. The interleaver 303 changes the arrangement of the encoded data bit sequence provided by the multiplexer 302 according to a predetermined rule. Then, the encoded data bit sequence output from the interleaver 303 is provided to the pre-coder 304, where the encoded data bit sequence becomes a channel data bit sequence ci.

The channel data bit sequence ci output from the turbo encoder 30 as mentioned above is supplied to the LD driver 31. Then, the channel data bit sequence ci is written bit by bit in the optical disk 100 by operation of the LD driver 31 as mentioned in above.

Figure 1:
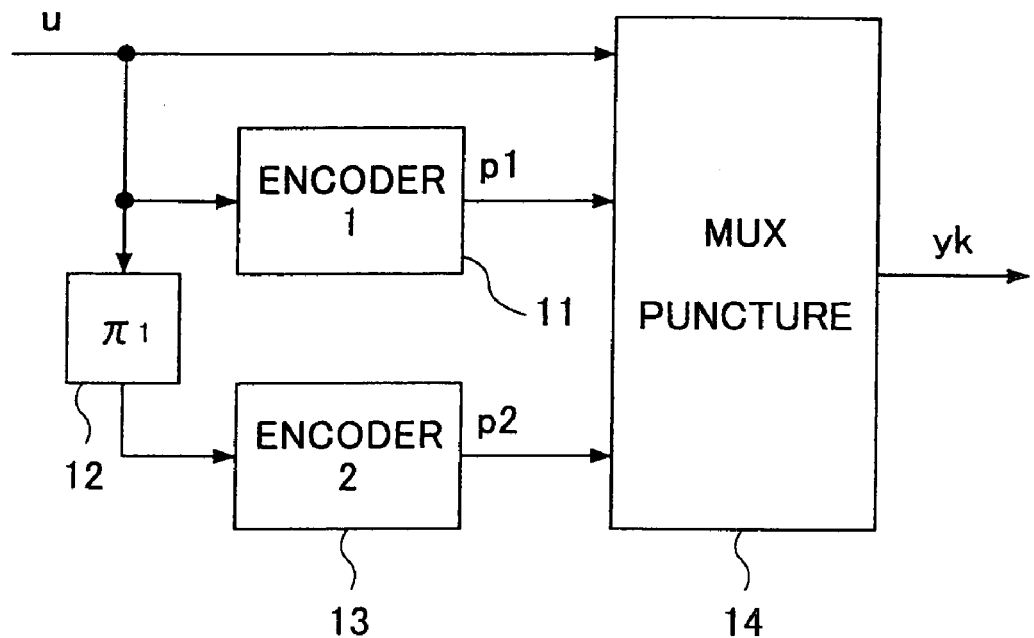
FIG. 1 is a block diagram showing a configuration example of a turbo encoding unit.
Figure 2:
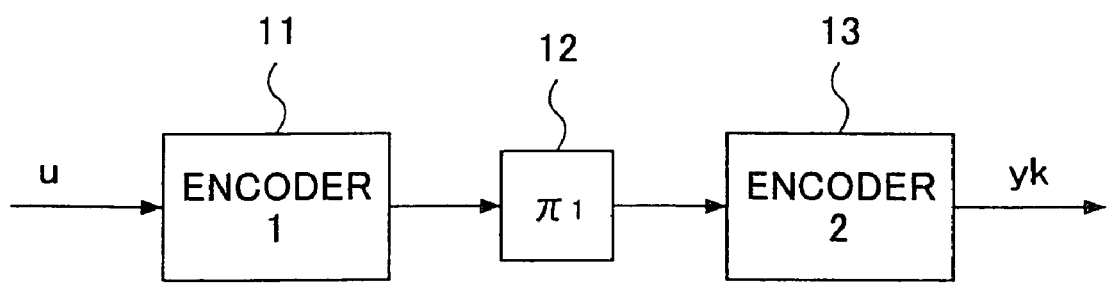
FIG. 2 is a block diagram showing another configuration example of the turbo encoding unit.
Figure 3:
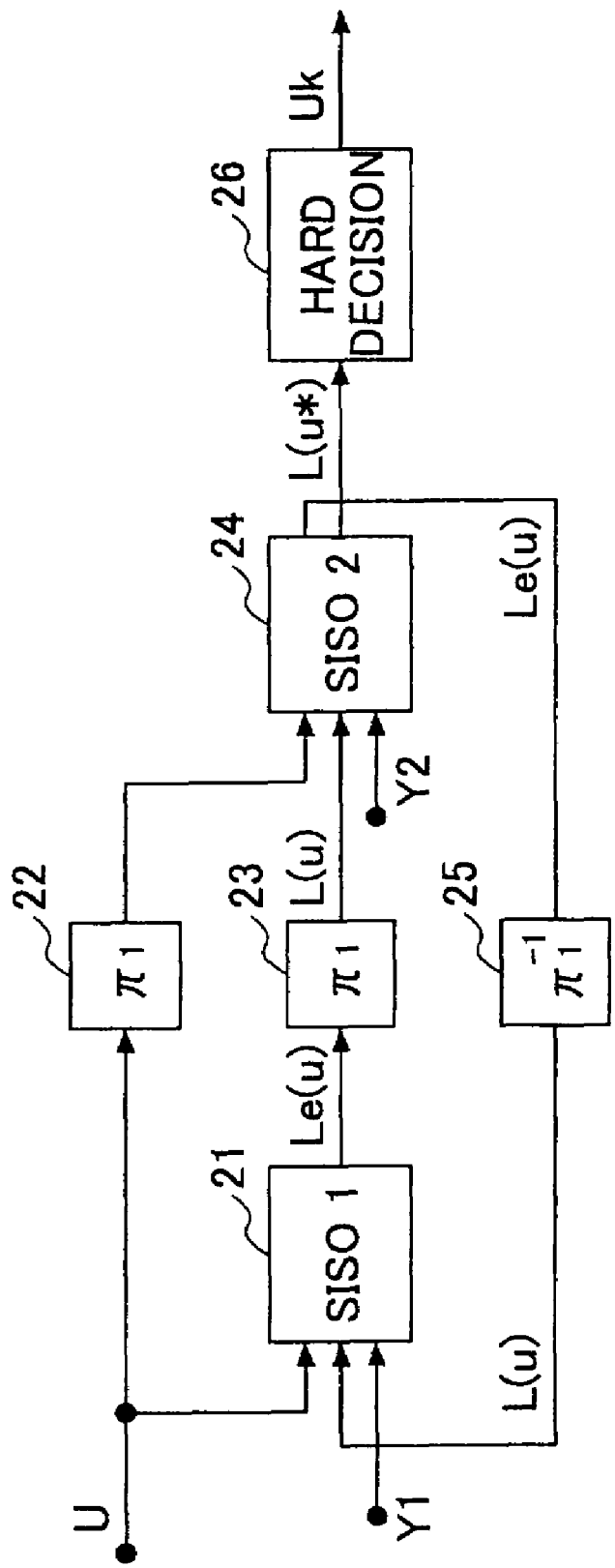
FIG. 3 is a block diagram showing a configuration example of a decoding unit corresponding to the turbo encoding unit shown in FIG. 1.

In reference to FIG. 4, again, the reading system of the optical disk apparatus includes an amplifier (Amp) 41, AGC (automatic gain controller) 42, a low-pass filter (LPF) 43, an equalizer (EQ) 44, and an analog-to-digital converter (A/D) 45. The waveform of an MO signal to be reproduced is output from an optical detector (not shown) that receives an optical beam reflected from the optical disk 100, and is re-shaped by the amplifier 41, AGC 42, the low-pass filter 43, and the equalizer 44 such that the waveform can be considered as a PR (partial response) waveform. In other words, the signal to be reproduced from the optical disk 100 can be considered as encoded by a PR channel. In this manner, the configuration of the turbo encoding unit as shown in FIG. 2 is realized by the writing system (the turbo encoder 30) and the encoding function practically by the PR channel.

The reading system further includes a memory unit 46, an iterative decoder 47, and a controller 48. The signal after equalizing the waveform is converted to digital values (sampled values) by the A/D 45 at a predetermined sampling cycle, and the sampled values yi that are output one by one from the A/D 45 are stored in the memory unit 46. Then, the sampled values yi stored in the memory unit 46 are decoded (iterative decoding) by the iterative decoder 47 for every predetermined quantity. The controller 48 controls operation, decoding conditions, etc. of the iterative decoder 47. The iterative decoder 47 repeats decoding, and outputs a data sequence uk* that is reproduced.

Figure 6:
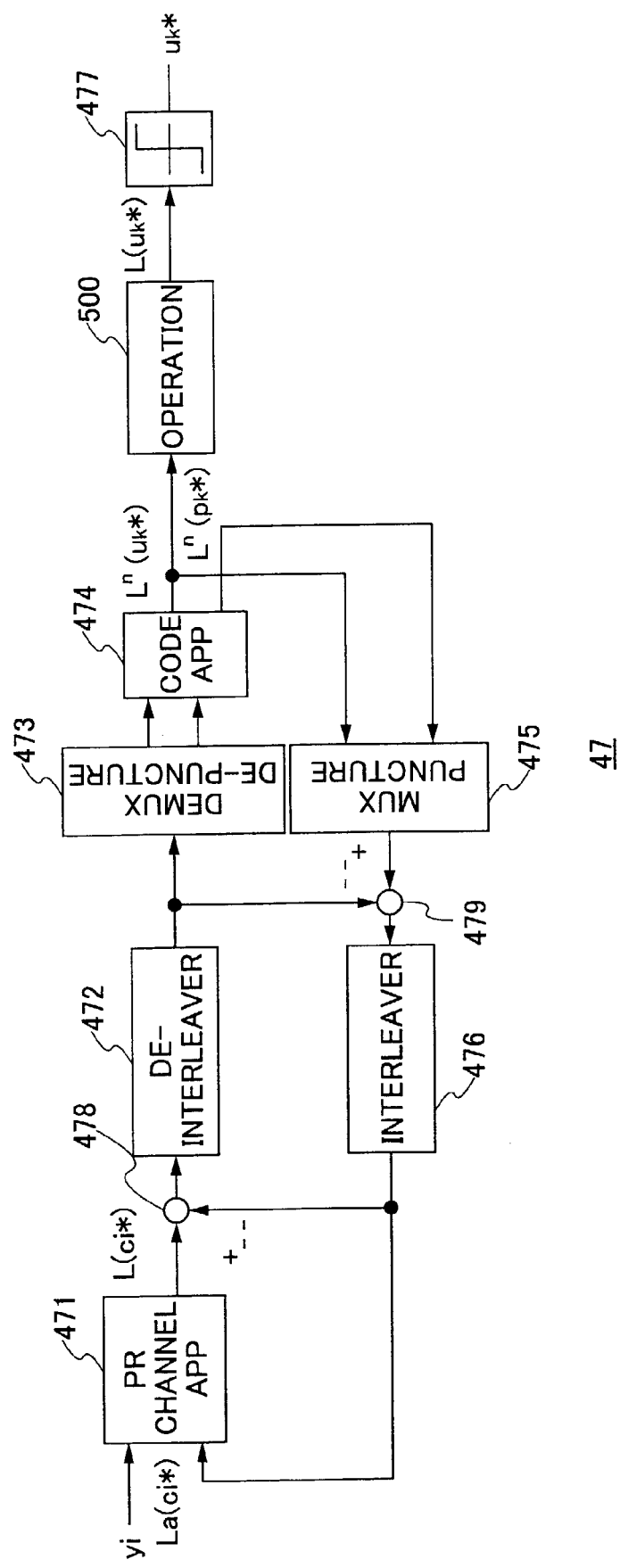
FIG. 6 is a block diagram showing a configuration example of an iterative decoder of the optical disk apparatus shown in FIG. 4.

As mentioned above, the iterative decoder 47 includes a decoder corresponding to the turbo encoder 30 and the encoding function in the PR channel of the reading system, and is configured, for example, as shown in FIG. 6.

In FIG. 6, the iterative decoder 47 includes a PR channel decoder 471, a de-interleaver 472, a demultiplexer (DE-MUX) 473, a decoder 474, a multiplexer (MUX) 475, an interleaver 476, a hard decision unit 477, subtracting units 478 and 479, and an operation circuit 500.

The PR channel decoder 471 is a decoder corresponding to the encoding function of the PR channel mentioned above, and performs a posteriori probability (APP) decoding. Specifically, a log likelihood ratio $L(ci^*)$ is calculated based on a ratio of the probability $P(ci=1|Y)$ of a bit ci being 1, to the probability $P(ci=0|Y)$ of the bit being 0, under the condition that a group Y of sampled values (y1, y2, ..., yn) is detected. Namely, $L(ci^*)$ is expressed by the following formula (4).

$$L(ci^*)=\ln\{P(ci=1|Y)/P(ci=0|Y)\} \quad (4)$$

Each probability is calculated based on the trellis diagram expressing transition of each sampled value yi.

Since the log likelihood ratio (LLR) $L(ci^*)$ is calculated according to the formula (4), values of $L(ci^*)$ range between a negative value LLR"0"$_{max}$ at which the probability of a bit being 0 is the highest and a positive value LLR"1"$_{max}$ at which the probability of the bit being 1 is the highest.

Prior information $La(ci^*)$ based on an output from the decoder 474 (to be described later) is subtracted from the log likelihood information $L(ci^*)$ that the PR channel decoder 471 outputs by the subtraction unit 478, and, in this manner, extrinsic likelihood information is acquired.

The sequence of the extrinsic likelihood information acquired one by one as mentioned above is changed by the de-interleaver 472 according to the change rule of the turbo encoder 30, and supplied to the demultiplexer 473. The demultiplexer 473 demultiplexes the sequence of likelihood information that is input sequentially to a sequence of likelihood information L(uk) corresponding to the data bit sequence uk, and a sequence of likelihood information L(pk) corresponding to the parity bit pk. Further, when demultiplexing, information is added (depuncture function) according to the culling rule (puncture function of the multiplexer 302) applied to the encoding process.

The decoder 474 that corresponds to the turbo encoder 30 of the writing system performs a posteriori probability decoding (APP). Specifically, a log likelihood ratio $L^n(u^*)$ expressed by an a posteriori probability concerning data bits (a probability of uk being 1, and a probability of uk being 0) and a log likelihood radio $L^n(p^*)$ expressed by an a posteriori probability concerning parity bits (a probability of pk being 1, and a probability of pk being 0) are calculated based on the prior information L(uk) that is the likelihood information about the data bits and the prior information L(pk) that is the likelihood information about the parity bits, respectively. Here, n expresses the number of repetition times, which is a positive integer.

The sequence of the log likelihood ratio $L^n(u^*)$ and the sequence of the log likelihood ratio $L^n(p^*)$ that are output one by one from the decoder 474 are supplied to the multiplexer (MUX) 475. The multiplexer 475 multiplexes the sequence of the log likelihood ratio $L^n(uk^*)$ and the sequence of the log likelihood ratio $L^n(pk^*)$, and performs culling according to a predetermined rule (puncture function). Consequently, likelihood information $L(c^*)$ is output from the multiplexer 475.

Then, the subtracting unit 479 subtracts the prior information (before demultiplexed to L(uk) and L(pk)) supplied to the decoder 474 from the likelihood information $L(c^*)$. The result is supplied to the interleaver 476.

The interleaver 476 changes arrangement of the sequence of the likelihood information, and the changed sequence is supplied to the subtracting unit 478 and the PR channel decoder 471 as prior information $La(ci^*)$.

In the iterative decoder 47 that includes two decoders, namely, the PR channel decoder 471 and the decoder 474, one decoder performs the decoding process repeatedly using the prior information provided by the other decoder (iterative decoding).

While the iterative decoding process is carried out for a predetermined number of times, the operation circuit 500 performs a predetermined operation on a plurality of log likelihood ratios $L^n(uk^*)$ that correspond to the same user data bit uk supplied by the decoder 474. The operation circuit 500 outputs the log likelihood ratio L(uk*), which is the operation result and serves as the final likelihood information relative to the user data bit uk. Details of the operation circuit 500 will be described later.

Figure 7:
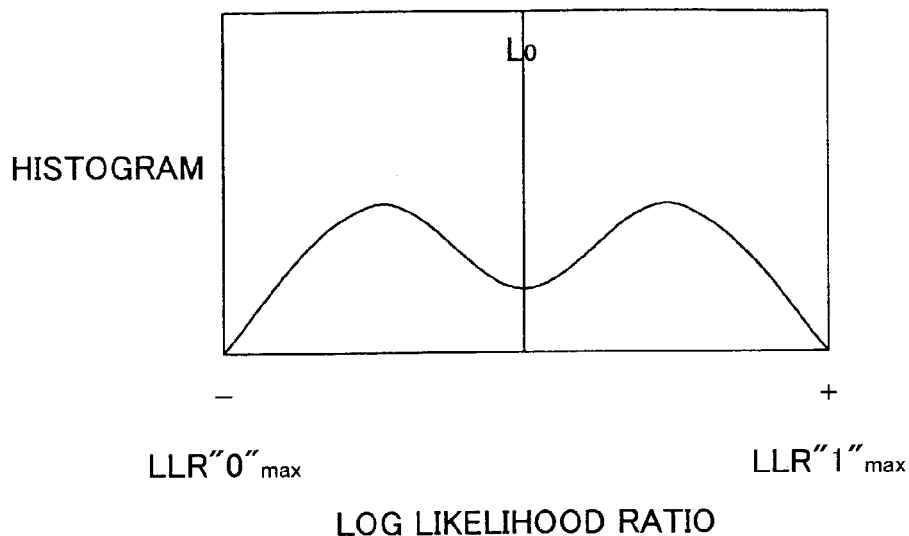
FIG. 7 shows relations between distributions of log likelihood ratios, and a slice level used for hard decisions.

The hard decision unit 477 determines whether a data bit is either 1 or 0 based on the log likelihood ratio L(uk*) output from the operation circuit 500, and outputs the data bit uk* as determined. As mentioned above, the log likelihood ratio L(uk*) takes a positive numerical value when the probability of the bit uk being 1 is greater than the bit being 0, and takes a negative numerical value when the probability of the bit uk being 1 is smaller than the probability of the bit being 0. Accordingly, the frequency distribution (histogram) of the log likelihood ratio L(uk*) obtained for various data bits uk looks like as shown in FIG. 7, where the histogram shows two peaks, one between the maximum value (LLR"1" max) and zero, and the other between the minimum value (LLR"0" max) and zero. Here, the LLR"1" max represents a point at which the probability of a bit being 1 is the highest, and the LLR"0" max represents a point at which the probability of a bit being 0 is the highest.

Since the log likelihood ratio L(uk*) is distributed in this manner, the hard decision unit 477 performs hard decision making on the log likelihood ratio L(uk*) using a slice level L0=0, and generates the data bit uk*. That is, the data bit uk* is determined to be 1, if the log likelihood ratio L(uk*) is a positive value, and the data bit uk* is determined to be 0, if the log likelihood ratio L(uk*) is a negative value.

Figure 8:
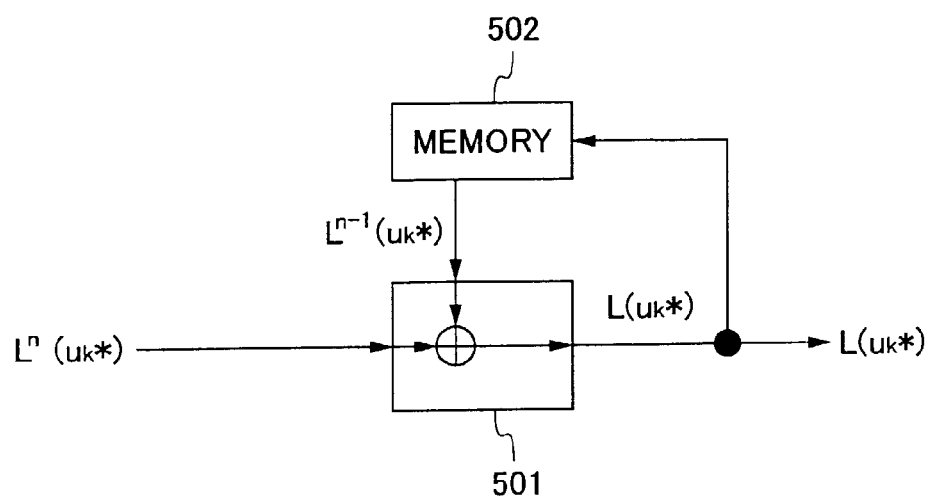
FIG. 8 shows the first configuration example of an operation circuit of the iterative decoder shown in FIG. 6.

FIG. 8 shows the first configuration example of the operation circuit 500.

With reference to FIG. 8, the operation circuit 500 includes an adding unit 501 and a memory unit 502, and adds a predetermined number of log likelihood ratios L″(uk*) of the same user data bit uk provided by the decoder 474 one by one. The result of the addition is output from the adding unit 501 as a final log likelihood ratio L(uk*) of the user data bit uk concerned.

That is, the adding unit 501 adds the log likelihood ratio L″(uk*) output from the decoder 474, and the latest result of addition $L^{n-1}(uk^*)$ that is stored in the memory unit 502, and outputs the log likelihood ratio L(uk*) obtained as the result. The log likelihood ratio L(uk*) output from the adding unit 501 is stored in the memory unit 502 as an updated addition result. By performing the above processes on the predetermined number of the log likelihood ratios L″(uk*) of the same user data bit uk output from the decoder 474 in the iterative decoding process, the addition of the predetermined number of the log likelihood ratios L″(uk*) is carried out.

In the memory unit 502, an initial value of the slice level L0 (refer to FIG. 7), e.g., zero, that is used by the hard decision unit 477 is stored.

Even if SNR of a signal to be reproduced is poor, and the predetermined number of log likelihood ratios of the same data bit uk obtained in the iterative decoding process are distributed near the slice level L0=0 (refer to FIG. 7) for the hard decision, the added value of the predetermined number of log likelihood ratios concerned surely turns into either a positive value or a negative value according to the distribution (that is, reliability becomes high). By performing the hard decision of the added value of the log likelihood ratios, a likelier data bit (1 or 0) is obtained.

Further, when SNR of the signal to be reproduced is relatively high, the value of the log likelihood ratios obtained turns into a greater value, and a highly likely data bit is obtained by the hard decision.

Figure 9:
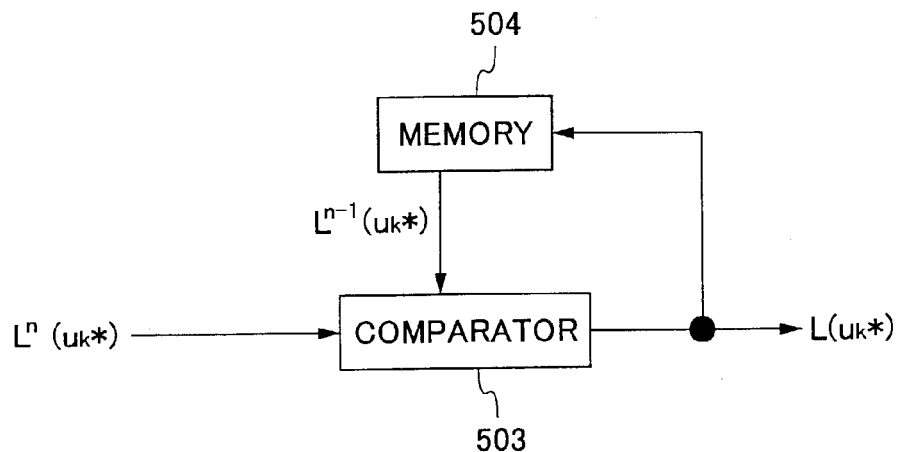
FIG. 9 shows the second configuration example of the operation circuit of the iterative decoder shown in FIG. 6.

FIG. 9 shows the second configuration example of the operation circuit 500.

With reference to FIG. 9, the operation circuit 500 includes a comparator 503 and a memory unit 504, and outputs the greatest value of a predetermined number of log likelihood ratios L″(uk*) of the same user data bit uk provided by the decoder 474 as the final log likelihood ratio L(uk*).

Namely, the comparator 503 compares the log likelihood ratio L″(uk*) output from the decoder 474 with the latest log likelihood ratio $L^{n-1}(uk^*)$ stored in the memory unit 504, and determines either of the log likelihood ratio L″(uk*) and $L^{n-1}(uk^*)$ as the log likelihood ratio L(uk*) to be output, according to the rule that follows.

$$L(uk^*)=L^n(uk^*), \text{ if}|L^n(uk^*)| \geq |L^{n-1}(uk^*)|.$$

$$L(uk^*)=L^{n-1}(uk^*), \text{ if}|L^n(uk^*)| < |L^{n-1}(uk^*)|.$$

The log likelihood ratio L(uk*) output from the comparator 503 is stored in the memory unit 504 as a target of the next comparison. By performing the above process to the predetermined number of the log likelihood ratios L″(uk*) of the same user data bit uk obtained by the iterative decoding by the decoder 474, the maximum value of the predetermined number of the log likelihood ratios L″(uk*) concerned is chosen as the final log likelihood ratio L(uk*). Similar to the first configuration example, the initial value of the slice level L0 used by the hard decision unit 477 is stored in the memory unit 504.

There are cases where a comparatively great log likelihood ratio suddenly occurs in the iterative decoding process, due to an excessively degraded SNR because of, for example, defects in the optical disk 100. Since the maximum value of a plurality of log likelihood ratios of the same user data bit uk is chosen as the final log likelihood ratio (high reliability is expressed), it is possible to obtain a likelier data bit.

Figure 10:
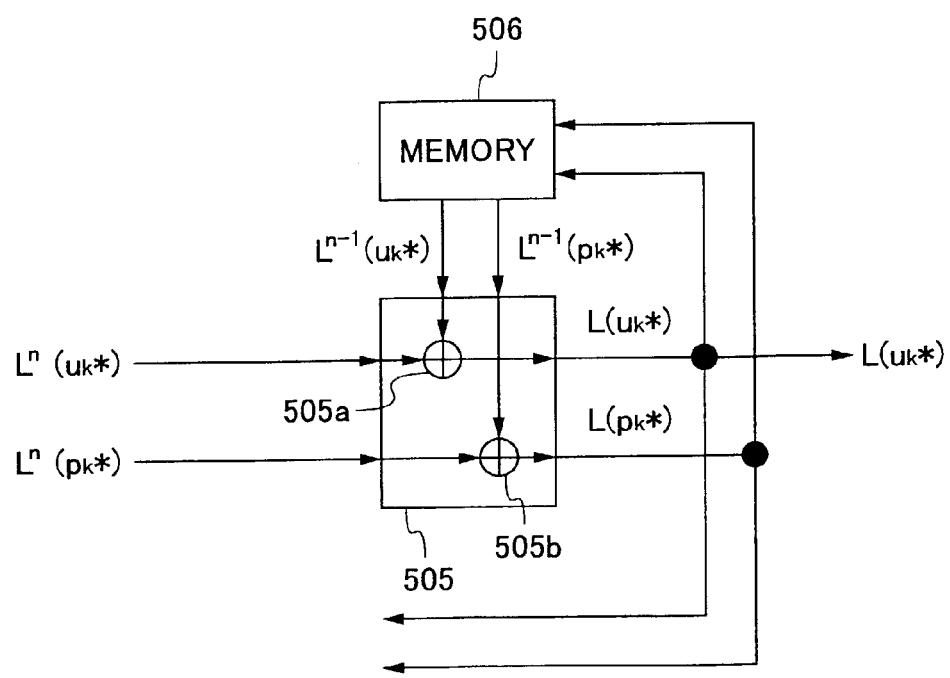
FIG. 10 shows the third configuration example of the operation circuit of the iterative decoder shown in FIG. 6.

FIG. 10 shows the third configuration example of the operation circuit 500. The operation circuit 500 processes not only the log likelihood ratio L″(uk*) corresponding to the user data uk provided by the decoder 474 but also the log likelihood ratio L″(pk*) corresponding to the parity bit pk.

With reference to FIG. 10, the operation circuit 500 includes an adding unit 505 that further includes a first adding unit 505a and a second adding unit 505b, and a memory unit 506. While adding a predetermined number of log likelihood ratios L″(uk*) of the same user data bit uk provided by the decoder 474 one by one, a predetermined number of log likelihood ratios L″(pk*) of the parity bit pk corresponding to the user data bit uk are added one by one.

That is, the first adding unit 505a of the adding unit 505 adds the log likelihood ratio L″(uk*) corresponding to the user data uk that is provided by the decoder 474 and the latest result of addition $L^{n-1}(uk^*)$ stored in the memory unit 506, and outputs the log likelihood ratio L(uk*) obtained as the result. Further, the second adding unit 505b of the adding unit 505 adds the log likelihood ratio L″(pk*) corresponding to the parity bit data pk that is provided by the decoder 474 in parallel with the log likelihood ratio L″(uk*) and the latest result of addition $L^{n-1}(pk^*)$ stored in the memory unit 506 corresponding to the parity bit pk, and outputs the log likelihood ratio L(pk*). The log likelihood ratios L(uk*) and L(pk*) output from the first and the second adding units 505a and 505b, respectively, are stored in the memory unit 506 as updated addition results. In this manner, the log likelihood ratios L″(uk*) corresponding to the user data bit uk are added one by one, and the log likelihood ratios L″(pk*) corresponding to the parity bit pk are added one by one.

The added value of the log likelihood ratios L″(uk*) and the added value of the log likelihood ratios L″(pk*) are supplied to the multiplexer 475 (refer to FIG. 6), and prior information based on the added values is supplied to the PR channel decoder 471. The added value of the predetermined number of the log likelihood ratios L″(uk*) of the same user data bit uk is supplied to the hard decision unit 477 (refer to the FIG. 4) as the final log likelihood ratio L(uk*).

According to the operation circuit 500 described above, since the prior information based on the log likelihood ratios L(uk*) and L(pk*) is provided to the PR channel decoder 471, the value of the log likelihood ratio L(ci*) from the PR channel decoder 471 is improved (more reliable), and further, the value of the log likelihood ratio L″(uk*) generated by the decoder 474, using the prior information based on the log likelihood ratio L(ci*), is improved. Thereby, the value of the log likelihood ratio L(uk*) corresponding to the user data bit uk output from the operation circuit 500 is remarkably improved. Thus, since the value (added value) of the log likelihood ratios L(uk*) corresponding to the user data bit uk is remarkably improved, the number of repetition times in the iterative decoding process can be reduced, while providing a highly likely (reliable) data bit.

Figure 11:
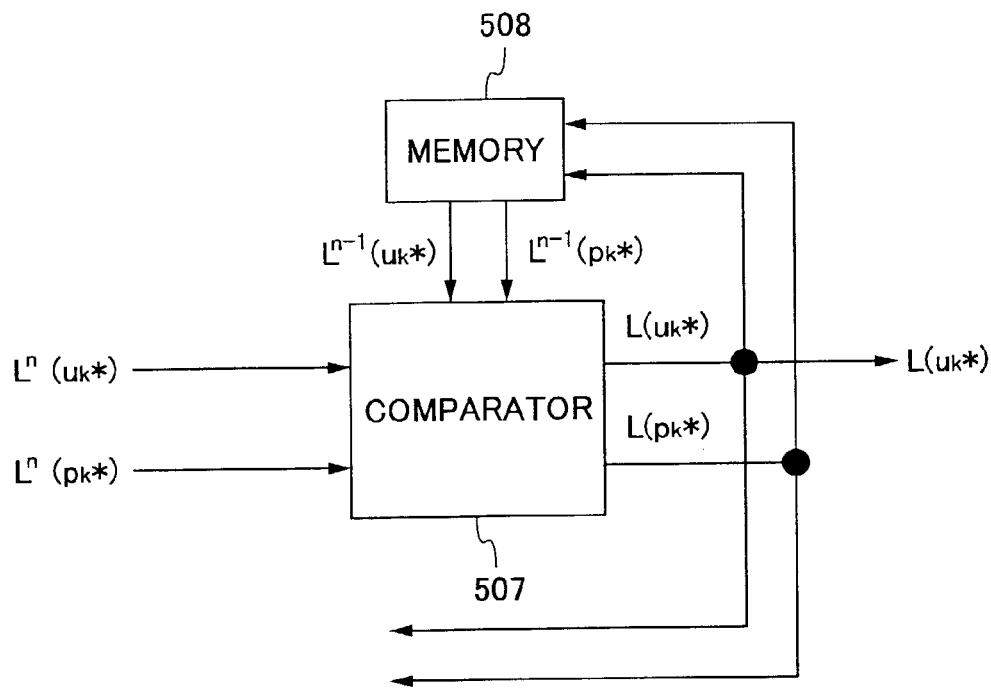
FIG. 11 shows the fourth configuration example of the operation circuit of the iterative decoder shown in FIG. 6.

The fourth configuration example of the operation circuit 500 is shown by FIG. 11. Not only the log likelihood ratio $L^n(uk^*)$ corresponding to the user data uk provided by the decoder 474 but also the log likelihood ratio $L^n(pk^*)$ corresponding to the parity bit pk is also processed in this example.

In reference to FIG. 11, the operation circuit 500 includes a comparator 507 and a memory unit 508. The log likelihood ratio $L^n(uk^*)$ corresponding to the user data bit uk provided by the decoder 474 and the log likelihood ratio $L^n(pk^*)$ corresponding to the parity bit pk are compared with the previous log likelihood ratios $L^{n-1}(uk^*)$ and $L^{n-1}(pk^*)$, respectively. The larger of the log likelihood ratios of the user data bit and the parity bit are always output.

Namely, the comparator 507 compares the log likelihood ratio $L^n(uk^*)$ which is output from the decoder 474 with the last log likelihood ratio $L^{n-1}(uk^*)$ stored in the memory unit 508, and compares the log likelihood ratio $L^n(pk^*)$ output from the decoder 474, as a pair with the log likelihood ratio $L^n(uk^*)$, with the last log likelihood ratio $L^{n-1}(pk^*)$ stored in the memory unit 508. The comparator 507 determines the log likelihood ratios $L(uk^*)$ to be output by selecting one of the log likelihood ratios $L^n(uk^*)$ and $L^{n-1}(uk^*)$, and determines $L(pk^*)$ to be output by selecting one of the log likelihood ratios $L^n(pk^*)$ and $L^{n-1}(pk^*)$, according to a rule such as follows.

$$L(uk^*)=L^n(uk^*), \text{ if}|L^n(uk^*)|\geq|L^{n-1}(uk^*)|,$$

$$L(uk^*)=L^{n-1}(uk^*), \text{ if}|L^n(uk^*)|<|L^{n-1}(uk^*)|,$$

$$L(pk^*)=L^n(pk^*), \text{ if}|Ln(pk^*)|\geq|L^{n-1}(pk^*)|,$$

and $$L(pk^*)=L^{n-1}(pk^*), \text{ if}|L^n(pk^*)|<|L^{n-1}(pk^*)|.$$

While the log likelihood ratios $L(uk^*)$ and $L(pk^*)$ are output from the comparator 507, and are stored in the memory unit 508 for comparison in the session to follow, the prior information based on the likelihood ratios $L(uk^*)$ and $L(pk^*)$ is provided to the PR channel decoder 471 (refer to FIG. 4). By performing the processes described as above to the predetermined number of the log likelihood ratios $Ln(uk^*)$ of the same user data bit uk output from the decoder 474 in the iterative decoding process, the maximum of the predetermined number of the log likelihood ratios $Ln(uk^*)$ is selected as the final log likelihood ratio $L(uk^*)$.

According to the operation circuit 500 described as above, since the prior information is always based on the comparatively greater (i.e., higher reliability) log likelihood ratios $L(uk^*)$ and $L(pk^*)$, and is given to the PR channel decoder 471, the log likelihood ratio $L(ci^*)$ from the PR channel decoder 471 provides a comparatively great value, and further, the log likelihood ratio $L^n(uk^*)$ generated by the decoder 474 using the prior information based on the log likelihood ratio $L(ci^*)$ provides a comparatively great value. Thereby, the value of the log likelihood ratio $L(uk^*)$ corresponding to the user data bit uk output from the operation circuit 500 becomes progressively greater. Thus, since the value of the log likelihood ratio $L(uk^*)$ corresponding to the user data bit uk becomes progressively greater, the number of repetitions in the iterative decoding processing can be relatively small, providing a higher likelihood ratio.

In the configuration examples of the operation circuit 500 described above, adding and comparing/selecting operations are performed one by one. However, the operations can be carried out simultaneously in a block mode. In this case, a mechanism that is capable of providing a predetermined number of the log likelihood ratios to the operation circuit 500 is configured as shown in FIG. 12, for example.

Figure 12:
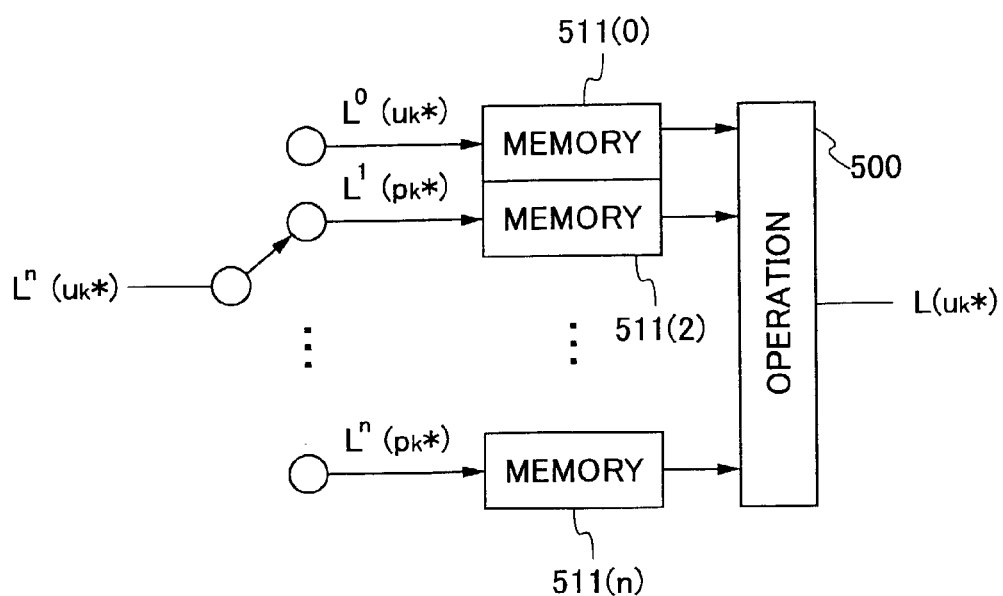
FIG. 12 shows a configuration example of a mechanism that gives a predetermined number of log likelihood ratios to the operation circuit.

In FIG. 12, n+1 pieces of memory units 511(0) through 511(n) are connected to the operation circuit 500. In this configuration, a log likelihood ratio $L^0(uk^*)$ that is output from the decoder 474 by the first decoding process of a certain user data bit uk is stored to the memory unit 511(0). Henceforth, each log likelihood ratio $L^i(uk^*)$ output from the decoder 474 by a subsequent decoding process is sequentially stored to the memory units 511(i) (i=1, 2, through n) every time the iterative decoding is performed.

When N user data bits u1-uN are processed in the above described manner, the predetermined number n+1 of pieces of the log likelihood ratios $L^0(u1^*)$ through $L^n(u1^*)$ of the same user data bit u1 stored to the memory unit 511(0) through 511(n), respectively, are simultaneously provided to the operation circuit 500. Then, the operation circuit 500 performs adding, comparing and selecting operations, and the like of the predetermined number of the log likelihood ratios $L^0(u1^*)$ through $L^n(u1^*)$ supplied collectively, and outputs the final log likelihood ratio $L(u1^*)$ corresponding to the user data bit u1. Henceforth, the final log likelihood ratio $L(uk^*)$ corresponding to each user data bit uk is output one by one by the same process.

Figure 13:
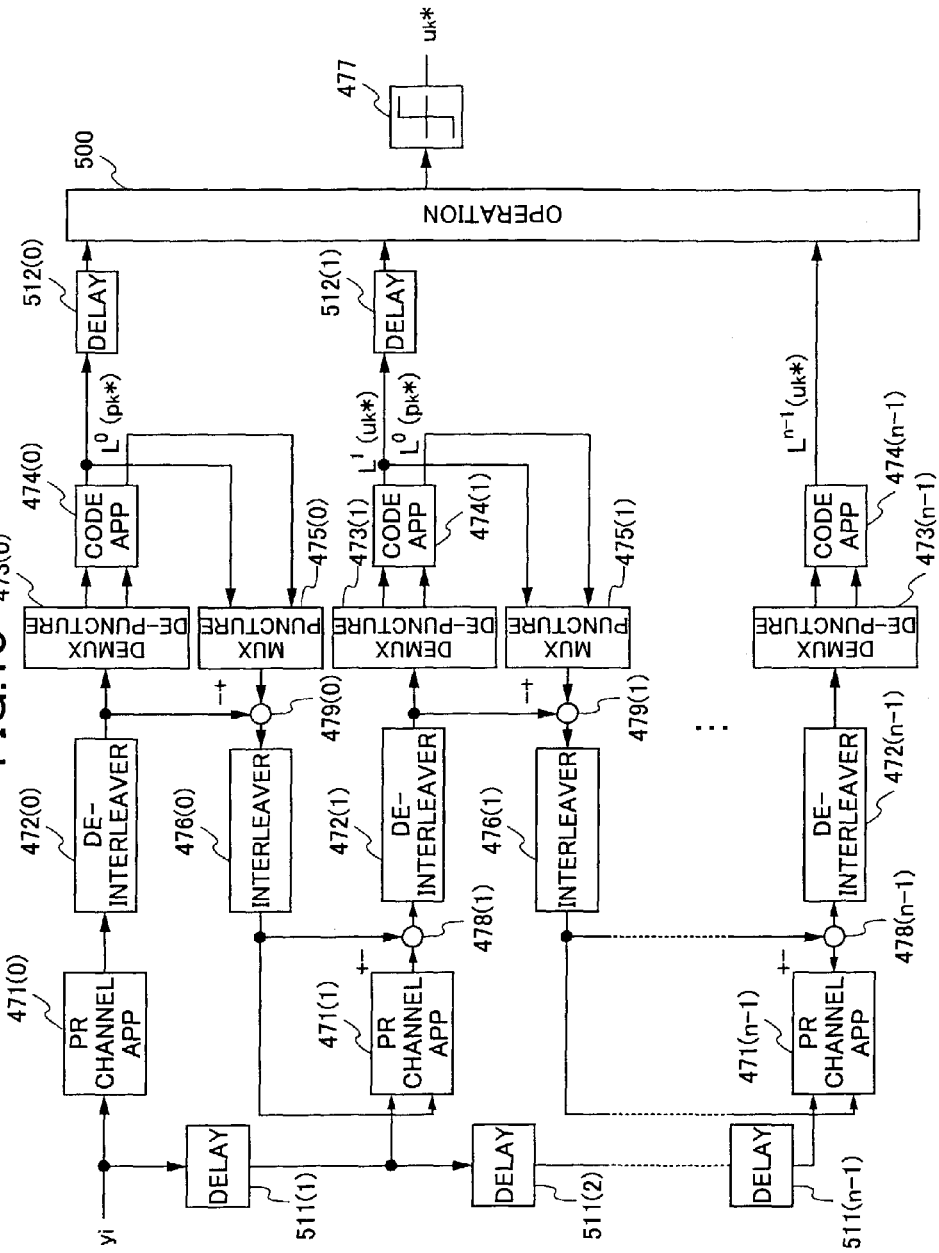
FIG. 13 shows another configuration example of the iterative decoder of the optical disk apparatus shown in FIG. 4.

Furthermore, the iterative decoder 47 can be configured as shown by FIG. 13. In this example, a plurality of decoding circuits are connected in series such that the iterative decoding process is substantially carried out.

In FIG. 13, the first-stage decoding circuit (located on the top of FIG. 13) includes a PR channel decoder 471(0), a de-interleaver 472(0), a demultiplexer (DEMUX) 473(0), a decoder 474(0), a multiplexer (MUX) 475(0), an interleaver 476(0), and a subtracting unit 479(0). That is, the configuration is almost identical to the portion that processes the likelihood information in the iterative decoder 47 shown in FIG. 6, except that there is no subtracting unit 478 after the PR channel decoder 471(0). The last-stage decoding circuit (located at the bottom of FIG. 13) includes a PR channel decoder 471(n–1), a de-interleaver 472(n–1), a demultiplexer (DEMUX) 473(n–1), and a decoder 474(n–1). The last decoding circuit is almost identical to the configuration of the portion that processes the likelihood information in iterative decoder 47 shown in FIG. 6, except that there is no route that returns the likelihood information from the decoder 474(n–1) to the PR channel decoder 471(n–1). Each of other middle-stage decoding circuits includes a PR channel decoder 471(j), a de-interleaver 472 (j), a demultiplexer (DEMUX) 473(j), a decoder 474(j), a multiplexer (MUX) 475(j), an interleaver 476(j) and subtracting units 478(j) and 479(j), where j=1 through n–2, which is almost the same configuration as the portion that processes the likelihood information in the iterative decoder 47 shown in FIG. 6.

To each of the PR channel decoders 471(j) other than the PR channel decoder 471(0) of the first stage and each of the subtracting units 478(j) of the decoding circuits, prior information is supplied from a corresponding interleaver 476(j–1) of the decoding circuit of the preceding stage. Further, in order that a sampled value yi is synchronously provided to all of the PR channel decoders 471(j) (j=0, . . . , n–1), while the sampled value yi is directly supplied to the PR channel decoder 471(0) of the first-stage decoding circuit, the sampled value yi is supplied to the rest of the PR channel decoders 471(j) (j=1, . . . , n–1) of the subsequent-stage decoding circuits through a delay circuit 511(j).

Further, in order that the supply timing of the log likelihood ratios $L^j(uk^*)$ (j=0, . . . , n–1) corresponding to the user data bit uk to the operation circuit 500 from the decoders 474(j) of the decoding circuit of each stage becomes synchronized, the log likelihood ratio $L^{n-1}(uk^*)$ from the decoder 474(n−1) of the last-stage decoding circuit is directly supplied to the operation circuit 500, while the log likelihood ratios $L^j(uk^*)$ from the decoders 474(j) in the decoding circuits of the stages other than the last stage are supplied to the operation circuit 500 through respective delay circuits 512(j).

In the iterative decoder 47 configured as described above, the decoding circuit of each stage carries out decoding, with the prior information based on the log likelihood ratio $L^j(ci^*)$ from the PR channel decoder 471(j) in the decoding circuit of each stage being supplied to the decoder 474(j), and the prior information based on the log likelihood ratios $L^j(uk^*)$ and $L^j(pk^*)$ from the decoder 474(j) being supplied to the PR channel decoder 471(j+1) of, the decoding circuit of the following stage. Further, the log likelihood ratios $L^0(uk^*)$ through $L^{n-1}(uk^*)$ of the same user data bit uk from the decoders 474(0) through 474(n−1), respectively, of each decoding circuit are supplied to the operation circuit 500 as n pieces of log likelihood ratios obtained in the process of iterative decoding.

The operation circuit 500 performs adding, comparing and selecting operations as described above to the n pieces of log likelihood ratios $L^0(uk^*)$ through $L^{n-1}(uk^*)$ provided by the decoder circuit of each stage, and the final log likelihood ratio $L(uk^*)$ is generated. Then, the final log likelihood ratio $L(uk^*)$ is provided to the hard decision unit 477 for determination, and the user data bit uk* is reproduced.

Figure 14:
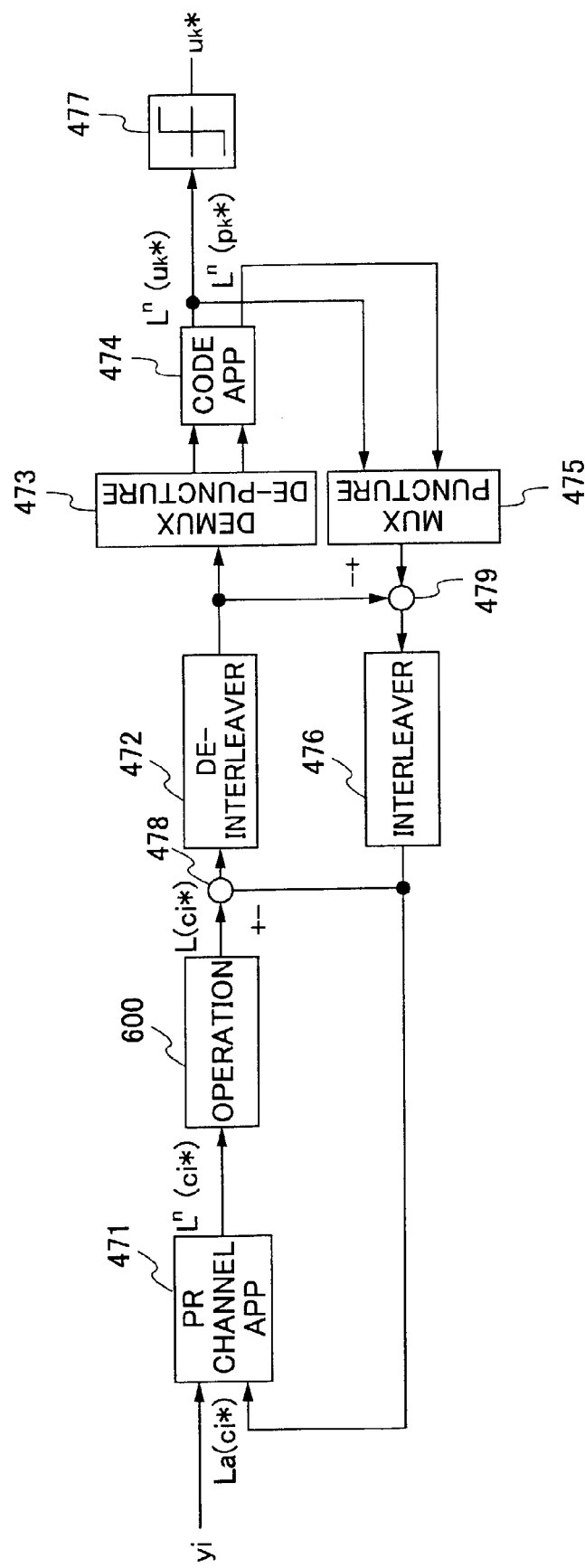
FIG. 14 shows another configuration example of the iterative decoder of the optical disk apparatus shown in FIG. 4.

In each example mentioned above, the operations (adding, comparing and selecting, etc.) are carried out on the predetermined number of log likelihood ratios $L^n(uk^*)$ output from the decoder 474 in the iterative decoding process and the final log likelihood ratio $L(uk^*)$ is generated. However, it is also possible to perform the operations on the predetermined number of log likelihood ratios $L^n(ci^*)$ output from the PR channel decoder 471 in the iterative decoding process. In this case, the operation circuit 500 in FIG. 6 of the iterative decoder 47 is replaced by an operation circuit 600, shown by FIG. 14, that performs the operations on the log likelihood ratios $L^n(ci^*)$ provided by the PR channel decoder 471.

The operation circuit 600 is configured as shown in FIG. 8 and FIG. 9, and performs the adding, comparing and selecting operations of a predetermined number of log likelihood ratios $L^n(ci^*)$ obtained in the iterative decoding process. Then, the prior information based on the log likelihood ratio $L(ci^*)$ obtained by the operations is supplied to the decoder 474.

In this case, the prior information provided to the decoder 474 is based on the log likelihood ratio $L^n(ci^*)$ that has a higher value (higher reliability) than the log likelihood ratio $L^n(uk^*)$ corresponding to the user data bit uk generated by the decoder 474. In this manner, a further likelier bit can be obtained by the hard decision performed relative to the higher log likelihood ratio.

According to the present invention, updated likelihood information having a higher likelihood of the bit value of original data can be generated by suitably defining a technique of predetermined operations that are performed relative to a plurality of pieces of likelihood information of the original data, which are obtained in the iterative decoding process, as mentioned above. Therefore, a data signal processing apparatus that is capable of reproducing the original data based on reliable log likelihood information obtained by a relatively small number of repetition times of the iterative decoding process is realized.

Further, the present invention is not limited to these embodiments, but various variations and modifications may be made without departing from the scope of the present invention.

The present application is based on Japanese priority application No. 2002-084257 filed on Mar. 25, 2002 with the Japanese Patent Office, the entire contents of that are hereby incorporated by reference.

What is claimed is:

1. A data processing apparatus that receives encoded data that are obtained by encoding original data, generates likelihood information of the original data according to an iterative decoding process that iteratively performs a predetermined decoding process on the encoded original data, and reproduces the original data based on the likelihood information acquired by the iterative decoding process, the data process apparatus comprising:

likelihood information operating means for performing predetermined operations on a plurality of pieces of said likelihood information of the original data obtained in the iterative decoding process, and for generating updated likelihood information for reproducing the original data based on the updated likelihood information, wherein the likelihood information operating means comprises:

storing means for storing the likelihood information; and operating means for performing the predetermined operations on both the likelihood information stored in the storing means and the likelihood information acquired by the iterative decoding process piece by piece, and for storing an operation result thereof in the storing means.

2. The data processing apparatus as claimed in claim 1, wherein the likelihood information operating means generates the updated likelihood information based on a predetermined number of pieces of the likelihood information corresponding to the original data obtained by iterating the iterative decoding process for a predetermined number of times, and performs a hard decision using the updated likelihood information for reproducing the original data.

3. The data processing apparatus as claimed in claim 1, wherein the updated likelihood information generated by the likelihood information operating means is used as a priori likelihood information in the iterative decoding process.

4. The data processing apparatus as claimed in claim 1, wherein the likelihood information operating means comprises likelihood information adding means that add a plurality of likelihood values that indicate a degree of reliability of the original data value being 1 or 0.

5. The data processing apparatus as claimed in claim 1, further comprising likelihood information selecting means that selects a piece of the likelihood information that is the likeliest as the updated likelihood information, the selection being made from a plurality of values that indicate the reliability of the original data being 1 or 0.

6. The data processing apparatus as claimed in claim 1, wherein an initial value of the likelihood information to be used in a hard decision for reproducing the original data is stored in the storing means.

7. The data processing apparatus as claimed in claim 1, wherein the operating means comprises adding means to add the likelihood information stored in the storing means and the likelihood information acquired by the iterative decoding process.

8. The data processing apparatus as claimed in claim 1, wherein the operating means comprises selecting means to select one piece of the likelihood information stored in the storing means and the likelihood information acquired by the iterative decoding process, whichever has the higher reliability.

9. The data processing apparatus as claimed in claim 1, wherein the likelihood information operating means comprises:
    storing means that stores a predetermined number of pieces of the likelihood information of the original data obtained in the iterative decoding process for a predetermined number of times, and
    operating means that simultaneously processes all the pieces of the predetermined number of pieces of the likelihood information stored in the storing means according to a predetermined rule.

10. The data processing apparatus as claimed in claim 9, wherein the operating means comprises adding means that simultaneously adds the predetermined number of pieces of the likelihood information.

11. The data processing apparatus as claimed in claim 9, wherein the operating means comprises selecting means that selects a piece of the likelihood information that indicates the highest reliability from the predetermined number of pieces of the likelihood information.

* * * * *